United States Patent
Czech et al.

(10) Patent No.: US 7,538,996 B2
(45) Date of Patent: May 26, 2009

(54) CIRCUIT WITH PROTECTION AGAINST ELECTROSTATIC DESTRUCTION

(75) Inventors: Martin Czech, Freiburg (DE); Michael Albert, Ettenheim (DE)

(73) Assignee: Micronas GmbH, Freiburg (DE)

( * ) Notice: Subject to any disclaimer, the term of this patent is extended or adjusted under 35 U.S.C. 154(b) by 332 days.

(21) Appl. No.: 11/259,378

(22) Filed: Oct. 26, 2005

(65) Prior Publication Data
US 2006/0092587 A1 May 4, 2006

(30) Foreign Application Priority Data
Oct. 26, 2004 (DE) ........................ 10 2004 052 093

(51) Int. Cl.
*H02H 9/00* (2006.01)
(52) U.S. Cl. ........................................ 361/56
(58) Field of Classification Search .................... 361/56
See application file for complete search history.

(56) References Cited

U.S. PATENT DOCUMENTS

| | | | | |
|---|---|---|---|---|
| 5,371,421 A | * | 12/1994 | Kondoh et al. | 326/73 |
| 5,510,731 A | | 4/1996 | Dingwall | 19/948 |
| 5,623,156 A | | 4/1997 | Watt | 257/355 |
| 6,057,726 A | * | 5/2000 | Sumida | 327/333 |
| 6,099,100 A | * | 8/2000 | Lee | 326/81 |
| 6,433,609 B1 | * | 8/2002 | Voldman | 327/313 |
| 6,445,210 B2 | * | 9/2002 | Nojiri | 326/68 |
| 6,501,630 B1 | * | 12/2002 | Colclaser et al. | 361/56 |
| 2003/0193362 A1 | | 10/2003 | Kobayashi | |
| 2004/0057173 A1 | | 3/2004 | Takikawa et al. | 361/56 |
| 2005/0286187 A1 | * | 12/2005 | Liu et al. | 361/56 |

* cited by examiner

*Primary Examiner*—Stephen W Jackson
*Assistant Examiner*—Ann T Hoang
(74) *Attorney, Agent, or Firm*—O'Shea Getz P.C.

(57) ABSTRACT

A circuit with protection against electrostatic destruction comprises at least two sections (A, B) composed of a first and second section (A, B). Each of the sections (A, B) has its own working voltage system with a fundamental voltage (USS or USS1) and a supply voltage (UDD or UDD1), and at least one connection (SC) between an information terminal (SA) of the first section (A) and an information terminal (SB) of the second section (B) to transfer information between the first section (A) and the second section (B). The connection (SC) has a transistor circuit with at least one transistor (X) of the first section (A), a resistance (R1), and a first transistor (E) of the second section (B), wherein the first transistor (X) is connected between the fundamental voltage (USS) of the first section (A) and the resistance (R1), and the first transistor (E) of the second section (B) is connected between the resistance (R1) and the supply voltage (UDD1) of the second section (B).

5 Claims, 3 Drawing Sheets

CIRCUIT WITH PROTECTION AGAINST ELECTROSTATIC DESTRUCTION

CROSS REFERENCE TO RELATED APPLICATIONS

This application contains subject matter related to commonly assigned application Ser. No. 11/259,630, filed Oct. 26, 2005. This application is hereby incorporated by reference.

PRIORITY INFORMATION

This patent application claims priority from German patent application 10 2004 052 093.3 filed Oct. 26, 2004, which is hereby incorporated by reference.

BACKGROUND OF THE INVENTION

The invention relates to the field of integrated circuits and in particular to an electrostatic discharge protective circuit.

Integrated circuits are becoming increasingly complex. They often contain separate components or sections that have their own voltage/power supply. In other words, out of at least two sections that form a first and second section of the circuit, each of the sections has its own separate working voltage system with ground as a fundamental voltage and a supply voltage. In order to transfer information, the two sections are linked by at least one connection. In other words, there exists one connection between an information terminal of the first section and an information terminal of the second section to transfer information between the first and the second sections.

In the event of electrostatic discharges potential differences occur between the sections or components that may destroy the structures of the circuit, in particular, through the connection between the information terminals. With increasing miniaturization of the design, the circuits become increasingly more sensitive to electrostatic discharges.

FIG. 5 illustrates, as an example, a segment of a crystal 1 of a circuit, where two sections A, B are located in an integrated circuit. The two sections A, B must be separated to the largest degree possible in order to prevent, for example, mutual interference effects. Nevertheless, signals or information must be exchanged between sections A, B. The signals are provided at corresponding information terminals, and in the case of a CMOS-based design originate in inverters or inverter-like structures such as a NAND gate or linear amplifiers. Typically, the signals are applied to the gates or control terminals of the MOS transistors of the respective other section B, A. If the voltage system, consisting of a supply voltage UDD and a ground or fundamental voltage USS of the first section A opposing the voltage system consisting of supply voltage UDD and fundamental voltage USS1 of the second section B, is now shifted in potential by an electrostatic discharge of destructive effect (i.e., by an ESD event) the potential difference is immediately transmitted through the transmission lines of connection SC on the substrate 1 to the gates of the MOS transistors of the other section. Within a few nanoseconds, these break down and are destroyed. In view of the fact that typical ESD events are in the KV or A range, whereas the gate oxides typically withstand only 6 volts for about 100 ns, it is immediately evident that such an arrangement is unsuitable.

FIG. 6 illustrates a prior art circuit having protection against electrostatic destruction. The circuit includes the first and second sections A, B, each with an applied supply voltage UDD or UDD1 and a fundamental voltage USS or USS1, respectively. The circuit also includes coupling elements KP that are connected between the two connection lines of the supply voltages UDD, UDD1 of the first and second sections A, B. Additional coupling elements KP are connected between the connection lines of the fundamental voltage USS, USS1 of the first and second sections A, B. The purpose of the coupling elements KP is to prevent or limit the potential differences of the working voltage system UDD-USS of the first section relative to the working voltage system UDD1-USS1 of the second section B. Various components are employed as coupling elements—for example, resistances, even the always present substrate resistance of an integrated circuit, diodes, bipolar transistors, or MOS transistor devices. In this configuration, the coupling elements are connected directly between the two working voltage systems of the two sections A, B. The connections SC to transfer information are formed separately.

This type of configuration is usable only to a limited extent since the coupling can be implemented only weakly, otherwise the isolation of the two sections A, B would be negated and disturbances would propagate through the lines and connections of the voltage supply. The coupling is especially problematic when the working voltage system UDD1-USS1 of the second section B has a different rated voltage than the working voltage system UDD-USS of the first section A. The constant flow of equalizing currents must be prevented. In light of these factors, the coupling elements or couplers often become quite ineffective, with the result that destructive actions continue to occur in response to electrostatic discharges. In the case of, for example, a coupler with a dynamic resistance of 10 Ohms, an ESD equalizing current of 1 A and a voltage difference of 10V between the working voltage systems of the sections A, B are sufficient to bring about immediate destruction of the gate oxides at the transitions of the first section A to the second section B, or visa versa.

Typical electronic systems on chips (SoC) currently have three or more separate components or sections with different rated voltages, with the result that the task of decoupling to prevent damage from electrostatic discharges is made that much more difficult. An additional number of couplers is required, such that the metal tracks that link these couplers generate an additional resistance within the coupling path. In parallel with this, the 100-ns breakdown voltages of the thin oxides continue to drop from one technology generation to the next. The measures used in the circuit of FIG. 6 are thus incapable of preventing damage by electrostatic discharges.

FIG. 7 illustrates a simplified technique of transferring information through a connection SC from an inverter IA2 in the first section A to an inverter IB2 in the second section B. Two diodes D1S, D2S are connected to a connection point OS at the input of the inverter IB2 of the second section B. The first diode D1S is connected between the node or connection point and the supply voltage UDD1 of the second section. The second of the diodes D2S is connected between the fundamental voltage USS1 and the connection point OS. The diodes D1S, D2S which are attached locally to the working voltage system of the second section B, limit the voltage at the inverter IB2 of the second section B. A resistance RS, which is connected between the output of the inverter IA2 and the connection point OS limits the equalizing current. The diodes D1S, D2S may also be in the form of parasitics of an MOS structure. This circuit together with the couplers of FIG. 6 provides protection from destruction by electrostatic discharges. However, the working voltage systems of the two sections A, B are no longer independent of each other. Working voltage system UDD1-USS1 of the second section B cannot, for example have a lower rated voltage than the working voltage system UDD-USS of the first section A, since otherwise in the accumulated number of inverters and resistances, significant equalizing currents would flow. Switching off the working voltage system UDD1-USS1 of the second section B is also hardly feasible. While this circuit functions in principle, it is nevertheless unsuited for the requirements of many systems.

Therefore, there is a need for improved protection against electrostatic destruction between two sections, each of which has its own working voltage system.

SUMMARY OF THE INVENTION

A circuit for protection against electrostatic destruction comprises at least a first section and a second section, where each of the sections has its own working voltage system with a fundamental voltage and a supply voltage. At least one connection between an information terminal of the first section and an information terminal of the second section transfer information between the first section and the second section. The connection has a transistor circuit comprising at least one series circuit composed of a first transistor of the first section, a resistance, and a first transistor of the second section. The first transistor is connected between the fundamental voltage of the first section and the resistance, and the first transistor of the second section is connected between the resistance and the supply voltage of the second section.

Transition between the first section and the second section may run through the resistance or between the resistance and one of the transistors connected thereto.

The connection may be formed by a current mirror circuit with the resistance in the form of an interconnected resistance.

A first diode may be connected between the fundamental voltage of the second section and a connection point between the first transistor of the second section and the resistance.

A second diode may be connected between the supply voltage of the first section and a connection point between the first transistor of the first section and the resistance.

The connection point may be connected to the control terminal of the first transistor and of a second transistor, where the second transistor is connected between the fundamental voltage (VSS) of the first section and the section's information terminal.

The control terminal of the first transistor of the second section may form the information terminal.

The connection may be formed by a level-shifting circuit with an interconnected resistance.

The information terminal of the first section may be connected in an inverted manner with the control terminal of the first transistor and in a non-inverted manner with the control terminal of a second transistor of the first section. The second transistor may be connected between the fundamental voltage of the first section and a second resistance, and a second transistor of the second section is connected between the second resistance and the supply voltage of the second section.

In the second section the control terminal of the first and the second transistor may be in each case connected to a connection point between the other transistor and its resistance.

In the second section the connection point between the second transistor and its resistance may be connected to the information terminal, in particular, through an inverter.

A diode may be connected to the supply voltage from the connection point between the second transistor and its resistance in the second section.

A second diode in the second section may be connected from the fundamental voltage to the connection point between the second transistor and its resistance.

In the design of the transistors, diodes may be designed as clamping diodes, in particular, as parasitic elements, to keep away harmful overvoltages.

These and other objects, features and advantages of the present invention will become more apparent in light of the following detailed description of preferred embodiments thereof, as illustrated in the accompanying drawings.

DETAILED DESCRIPTION OF THE INVENTION

Figure 1:
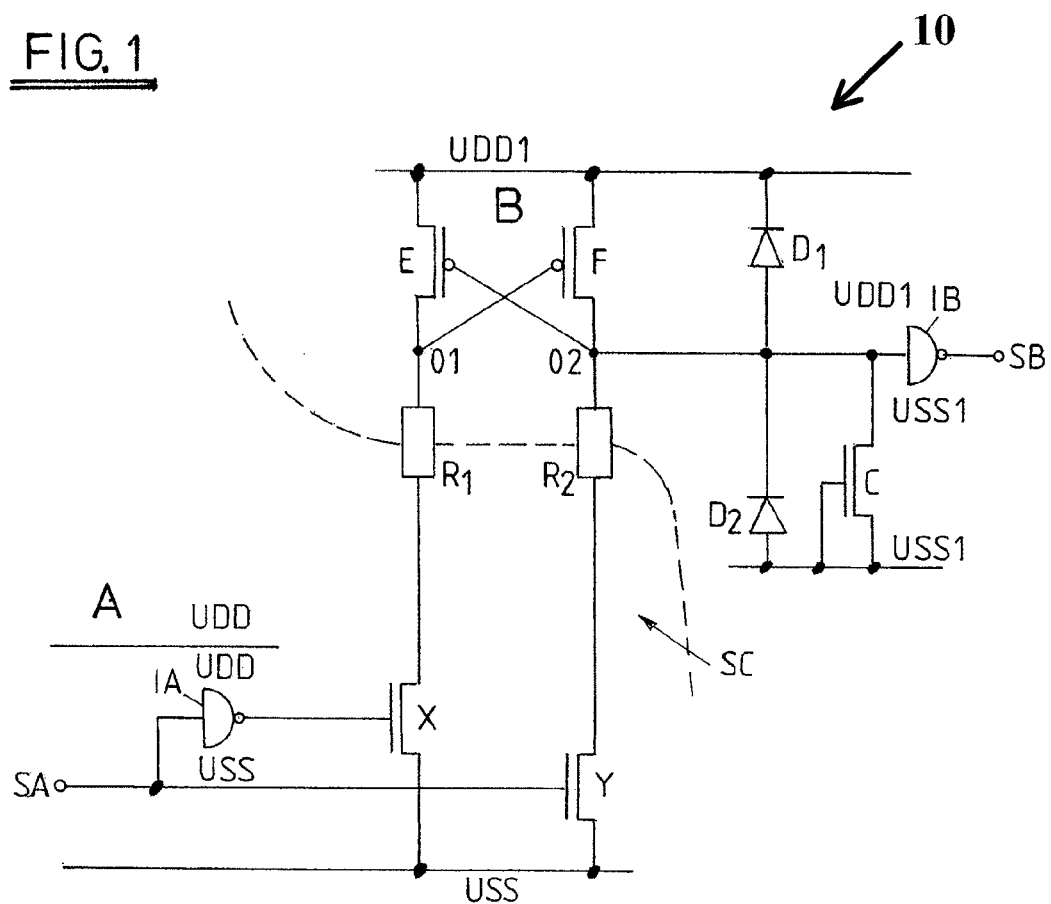
FIG. 1 is a simplified schematic illustration of a circuit with two sections, each of which has its own working voltage system, and which have various circuit components to transfer information, the components providing protection against electrostatic destruction.

FIG. 1 is a simplified schematic illustration of a circuit 10 comprising first and second sections A, B, respectively. The circuit 10 may include a plurality of electronic components on one or two interlinked circuit boards, or be configured in the class of an integrated circuit in which the two sections A, B are located on a common crystal 1. In this case, the described individual electronic components are designed as integrated circuits.

For the sake of simplicity, the illustration of the first section A shows only one information terminal SA to apply a signal to be transferred to the second section B, as well as the working voltage system UDD-USS. The working voltage system UDD-USS includes a ground or common fundamental voltage USS at a corresponding ground line, and a supply voltage UDD at a corresponding supply voltage line.

The second section B includes an information terminal SB to transfer information or signals to or from the first section A. In addition, the second section B has its own working voltage system UDD1-USS1 that provides a ground or fundamental voltage USS1 at a ground line, and a supply voltage UDD1 at a supply line. As governed by the specific design of the circuit, the two working voltage systems of the first and second sections A, B in principle can also be interlinked in terms of the fundamental voltage USS, USS1 and/or supply voltage UDD, UDD1. What are preferred in particular, however, are designs having independent working voltage systems UDD-USS, UDD1-USS1.

To provide protection against destruction in the event of electrostatic discharges in one or both of the sections A, B through a connection SC between the information terminals SA, SB of the two sections A, B, a plurality of individual components is connected between the two sections A, B. This arrangement provides ESD protection without restricting the functionality or applications of the circuit. To connect the two sections A, B according to a first preferred embodiment, a level-shifting circuit (level shifter) is employed. However, in contrast to a conventional level-shifting circuit, additional first resistances R1, R2, and optionally diodes D1, D2, or parasitic diodes of MOS transistors are used to limit voltages and currents. The information transfer is thus effected by a modified level-shifting circuit, primarily in the form of currents instead of a transfer in the form of voltages. The rated voltages of the sections A, B are not directly coupled to each other such that within the limits of the technological parameters of the transistors used, any voltages independent of each other can be used in the sections A, B. In particular, switching of one or both of the sections A, B independently of each other becomes feasible.

The information terminal SA of the first section A is connected to the control terminal of a first transistor X of the first section A through an inverter IA associated with the working voltage system UDD-USS of the first section A. The first transistor X is connected between the fundamental voltage USS of the first section A and a first resistance R1. The second terminal of the resistance R1 is connected to a first transistor E of the second section B via a node or connection point O1. The first transistor E is connected between the first resistance R1 and the supply voltage UDD1. The control terminal of the first transistor E is connected to the information terminal SB of the second section B by a node or second connection point O2 and an inverter IB of the second section B. The inverter IB is associated with the working voltage system UDD1-USS1. A first diode D1 is connected between the second connection point O2 and the supply voltage UDD1 of the second section B. A third transistor C and a second diode D2 are connected between the fundamental voltage USS1 and the second connection point O2. In addition, the control terminal of the third transistor C is connected to the fundamental voltage USS1.

The information terminal SA of the first section A is connected to a control terminal of a second transistor Y of the first section A. The second transistor Y is connected between the fundamental voltage USS and the second resistance R2. The second terminal of the second resistance R2 is connected to the second connection point O2. In addition, a second transistor F of the second section B is connected between the second connection point O2 and the supply voltage UDD1. The control terminal of the second transistor F is connected to the first connection point O1.

The first transistors X, E and the second transistors Y, F of the first and second sections A, B respectively, thus form a level-shifting circuit with the interconnected resistances R1, R2, and optionally the two clamping diodes D1, D2. Given a suitable design for the three transistors E, F, C of the second section B, the first and second clamping diodes D1, D2 may be present as parasitics. Since the remaining components of the first and second sections A, B do not have any particular functionality or design in terms of ESD protection, the outline illustrating the few components shown is sufficient.

Essentially, the basic function of the level shifter, which in expanded form makes up the connection SC between the information terminals SA, SB, is preserved. Depending on the input signal at the information terminal SA, the two transistors X, Y of the first section A pull down at the second or first transistors F, E of the second section B. As a result, the potential at the connection points O1, O2 decreases. As a result, that transistor E, F which is located on the node O2, O1 opposite the pulling transistor Y, X, switches on. This pulls up the opposing one of the nodes O2, O1, and finally switches off the transistor E or F in the second section B at the connection point O2 or O1 pulled by the transistor Y or X of the first section A. A new stable state has been reached. What takes place is a crosswise back-coupling of the two transistors E, F of the second section B.

It should be emphasized that the boundary between the first and second sections A, B runs crosswise through the circuit, in particular, through the two resistors R1, R2, or adjacent to these. With reference to any elements in the second section B, any elements within the first section A can implement equalizing movements such as common-mode interference, for example, by electrostatic discharge. Harmful overvoltages are kept away by the two diodes D1, D2 of the inverter IB in the second section B by clamping to this section's local supply voltage UDD1-USS1. Based on an appropriate design for the transistors E, F, C of the second section B, these diodes D1, D2 are preferably already present or implementable in the form of parasitic elements.

During these transients, the two resistances, R1, R2 will limit currents from the first section A to the second section B so that no destruction results from Joule heat. As a result, it is possible in an especially preferred approach in combination with known couplers, to prevent or at least further reduce destruction at the gates in the inverter IB in the second section B. The two sections A, B, may have any voltages as long as the transistors are technologically designed for this, and the circuit does not result in any, or any interfering, equalizing currents. In particular, it is possible for the voltage in the first section A to be operationally lower than the voltage in the second section B, or visa versa.

Figure 2:
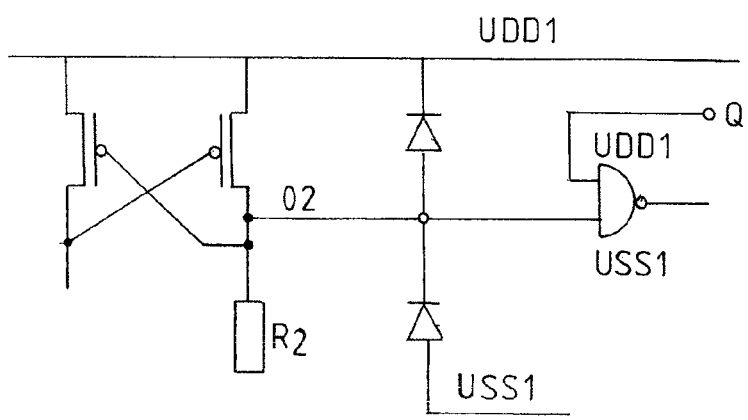
FIG. 2 is a schematic illustration of a circuit that has been modified in comparison to the circuit of FIG. 1.

The section A or B can be completely switched off without any negative concomitant phenomena occurring with respect, in particular, to the second section B. However, when the first section A is switched off, leakage currents or spurious signals may penetrate from the first section A to the second node O2 due to rectifier effects, as is illustrated in FIG. 2. While no damage will occur as a result, the second section B or components in this section may nevertheless be interfered with or disturbed. To avoid this, a logical clamping element of the circuit is preferably added, which element, for example, in the form of a NAND circuit by way of an input Q, prevents any propagation of such these signals.

Figure 3:
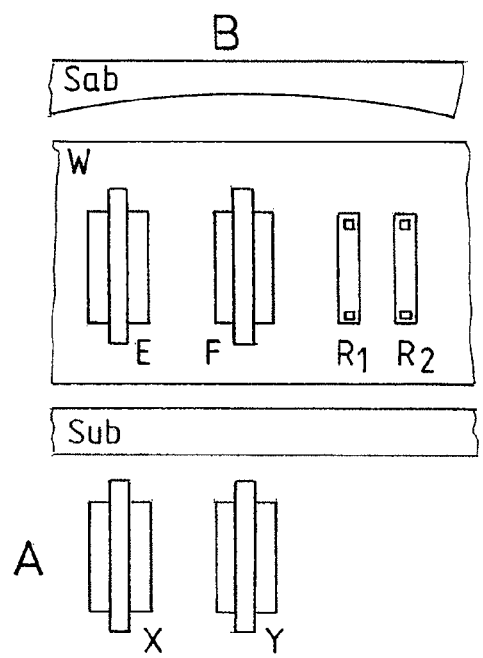
FIG. 3 is a simplified illustration in outline form of the components of an integrated circuit to implement the system of FIG. 1.

FIG. 3 is a top view schematically illustrating the distribution of individual electronic components on an integrated circuit having two sections A, B. The two sections A, B should be connected as in the configuration of FIG. 1. The arrangement shown illustrates an example of a layout that can be implemented economically. The first section A is configured with two transistors X, Y that correspond, as an example, to the two transistors of FIG. 1. The second section B with its corresponding components is offset therefrom.

Extending from the first section A towards the second section B, perpendicular to the first section A, is a section of an optional substrate ring Sub, followed by a well W and again a section of an additional substrate ring or of substrate ring Sub. The two resistances R1, R2, and the first and second transistors E, F are arranged in the well W based on the P-channel MOS field-effect transistor (PMOST) design. The boundary between the first and second sections can in this way be implemented practically.

The ESD protective function described in connection with FIG. 1 can be combined with a separation of the substrate or crystal 1 by well W with interference-dissipating substrate rings Sub, to reduce the interference component moving through the substrate from the first section A to the second section B, or in the reverse direction. The substrate rings Sub should be connected directly to the corresponding ground potential USS of the respective side or the respective section A, B. The substrate rings Sub, or the corresponding regions, thereby prevent disturbances from being directly passed to the supply points or information terminals SA, SB. The equalizing currents created thereby should not be dragged into sensitive networks of the circuits in the sections A, B, and this property can be achieved by a layout design of this type. By chaining a plurality of these layout cells, it is possible to erect a continuous barrier between sections A and B through which signals nevertheless continue to pass back and forth reliably. In particular, a plurality of additional sections can be strung together in this way in any direction of the layout.

Figure 4:
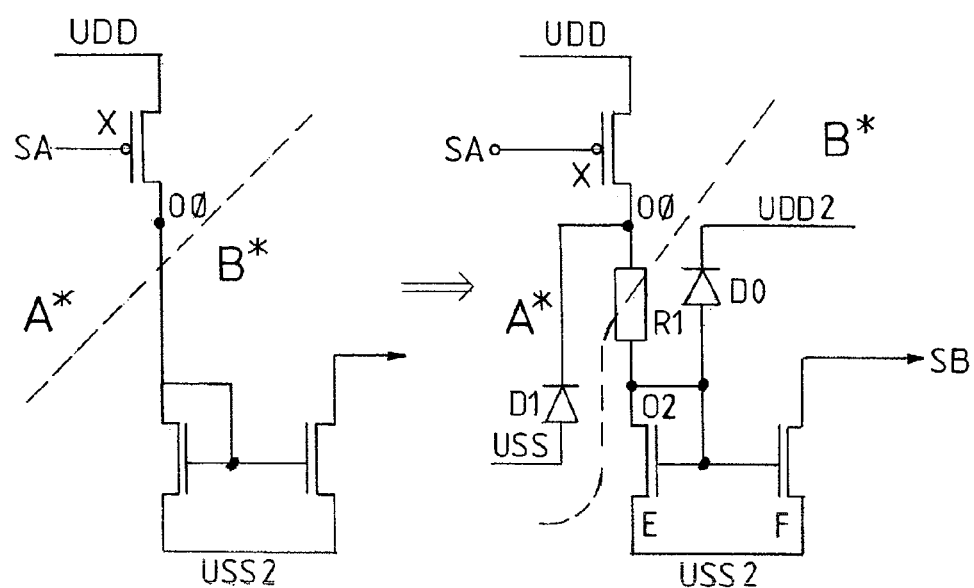
FIG. 4 illustrates an alternative embodiment circuit having components to protect against electrostatic destruction and, at the same time, the ability to transfer information.
Figure 5:
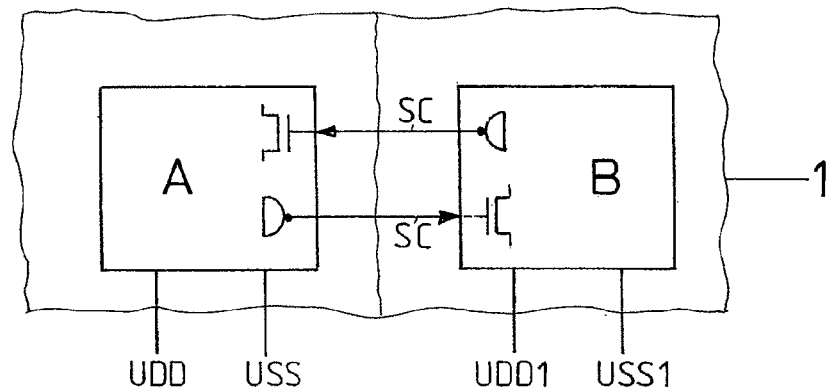
FIGS. 5-7 show various prior art circuits.
Figure 6:
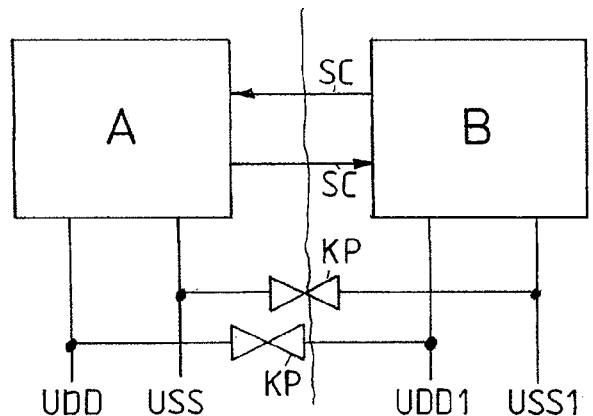
Figure 7:
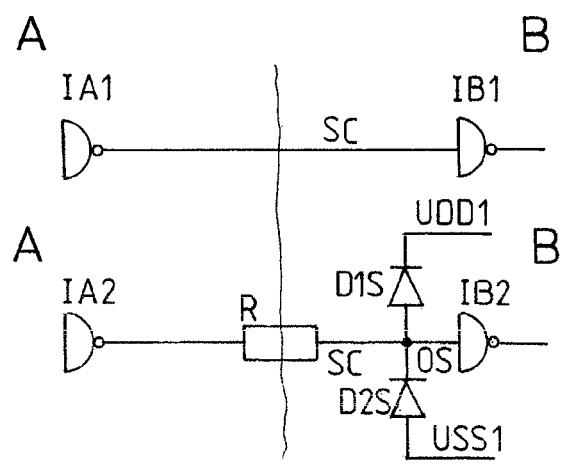

Whereas FIGS. 1 and 2 illustrate a circuit based on a level-shifting circuit, FIG. 4 indicates how it is also possible to transfer the above-described technique to linear circuits to protect them against electrostatic destruction. As described in illustrative fashion in this regard, a cutting of the two branches of the level shifter is performed such that a residual circuit remains that resembles the essentially known current mirror circuit.

FIG. 4 shows on the left side a conventional current mirror that transfers signals SA from first section A* to a second section B*. A first transistor X of the first section A* is connected between the supply voltage UDD and a first connection point O0 or transition point to the second section B*. A current mirror is located in the second section B*, and the current mirror is connected to the supply fundamental voltage USS2 of the second section B* as the antipole. Disturbances are thus transferred from one to the other section A*, B*.

Illustrated on the right side of FIG. 4 is an expanded current mirror circuit that provides ESD protection. As compared to the conventional circuit, again a resistance R1 and two diodes D0, D2 in the form of clamping diodes are inserted, analogous to FIGS. 1 and 2.

The first transistor X, to which the signal SA is applied to control the transistor, is connected between the supply voltage UDD of the first section A* and first connection point O0 of first section A*. In addition, a first diode D1 is connected between the base or fundamental voltage USS and first connection point O0. A resistance R1 is connected between the first connection point O0 of the first section A* and a second connection point O2 of the second section B*. The boundary between the first and second sections A*, B* runs between the resistance R1, or adjacent thereto.

A current mirror that includes the two transistors E, F is connected from the second connection point O2 and a base or fundamental voltage USS2 of the second section B*. The first of these transistors E is connected directly between the second connection point O2 and fundamental voltage USS2. The second transistor F is connected between the fundamental voltage USS2 and an information terminal SB of the second section B*. In addition, a control signal is applied through a connection between the second connection point O2 and the two control terminals of the two transistors E, F. A second diode DO is connected between the second connection point O2 and the supply voltage UDD2 of the second section B*.

The two circuits may be applied in any CMOS circuit that has two or more different nominally equal or unequal working voltage systems. Particular advantages are provided when there are large differences between the various working voltages. This is true, for example, in the case of advanced CMOS processes of the 0.18 μm or 0.13 μm class where the core voltage is only 1.8 V or 1.2 V, but where the input-output voltage is 3.3V.

Application of the present invention is not restricted to digital circuits. Analog circuits also require level shifters of this type for digital control signals, et cetera, so that such a transfer is possible.

In addition, application is feasible in discrete systems and is not restricted to an integrated circuit. Furthermore the polarities of the voltages and transistor types can be interchanged in the usual manner. In principle, the circuit can also be designed using bipolar transistors.

In addition, the circuit can be employed in very large systems in which only one higher-level system for the voltage exists which is nevertheless so large that two remote points of the large system must be treated as separate networks. In the case of a chip, this may be true even with a wiring length of a few millimeters.

The level shifter core can also be readily combined with various known acceleration techniques wherein it is nevertheless possible to implement the principle of the described circuits. The electronic components, in particular the resistances, can be of any desired design, in particular, diffused resistances having a high breakdown voltage, or insulated resistances such as metal-film or polysilicon resistances.

Although the present invention has been illustrated and described with respect to several preferred embodiments thereof, various changes, omissions and additions to the form and detail thereof, may be made therein, without departing from the spirit and scope of the invention.

What is claimed is:

1. A CMOS level shifter circuit with protection against electrostatic discharge, comprising:
    a first inverter that receives a first input signal and provides an inverted first input signal;
    a first resistance;
    a second resistance;
    a first transistor that includes a first gate which receives the inverted first input signal, a first source that is connected to a first voltage potential and a first drain;
    a second transistor that includes a second gate which receives the first input signal, a second source that is connected to the first voltage potential and a second drain;
    a third transistor having a third source connected to a second voltage potential and a third drain connected to the first drain through the first resistance, and a third inverting gate;
    a fourth transistor having a fourth source connected to the second voltage potential and fourth drain that provides a fourth gate signal and is connected to the second drain through the second resistance, and a fourth inverting gate connected to the third drain, where the third inverting gate is connected to the fourth drain;
    a second inverter that receives the fourth gate signal and provides an output signal; and
    a fifth transistor having a fifth gate and fifth source connected to a third voltage potential and a fifth drain responsive to the fourth gate signal.

2. The CMOS level shifter circuit of claim 1, further comprising:
    a first diode having a first cathode responsive to the second voltage potential and a first anode responsive to the fourth gate signal; and
    a second diode having a second cathode responsive to the fourth gate signal and a second anode responsive to a third voltage potential.

3. A CMOS level shifter circuit for protection against electrostatic discharge, comprising:
    a first inverter that receives a first input signal and provides an inverted first input signal;
    a first resistance;
    a second resistance;
    a first transistor that includes a first gate which receives the inverted first input signal, a first source that is connected to a first voltage potential and a first drain;

a second transistor that includes a second gate which receives the first input signal, a second source that is connected to the first voltage potential and a second drain;

a third transistor having a third source connected to a second voltage potential and a third drain connected to the first drain through the first resistance, and a third inverting gate;

a fourth transistor having a fourth source connected to the second voltage potential and fourth drain that provides a fourth gate signal and is connected to the second drain through the second resistance, and a fourth inverting gate connected to the third drain, where the third inverting gate is connected to the fourth drain;

a boolean logic element that receives the fourth gate signal and a second input signal and provides an output signal; and a fifth transistor having a fifth gate and fifth source connected to a third voltage potential and a fifth drain responsive to the fourth gate signal.

4. The CMOS level shifter circuit of claim 1, further comprising:

a first diode having a first cathode responsive to the second voltage potential and a first anode responsive to the fourth gate signal; and a second diode having a second cathode responsive to the fourth gate signal and a second anode responsive to a third voltage potential.

5. A CMOS level shifter circuit with protection against electrostatic discharge, comprising:

a resistance;

a first transistor that includes a first gate which receives an input signal, a first source that is connected to a first voltage potential and a first drain;

a second transistor having a second source connected to a second voltage potential and second drain connected to the first drain through the resistance, and a second gate connected to the second drain;

a third transistor having a third source connected to the second voltage potential and a second drain that provides an output signal, and a third gate connected to the second gate;

a first diode having a first cathode connected to the first drain and a first anode connected to a third voltage potential; and a second diode having a second cathode connected to a fourth voltage potential and a second anode connected to the second gate and third gate.

* * * * *

UNITED STATES PATENT AND TRADEMARK OFFICE
CERTIFICATE OF CORRECTION

PATENT NO.       : 7,538,996 B2
APPLICATION NO.  : 11/259378
DATED            : May 26, 2009
INVENTOR(S)      : Czech et al.

Page 1 of 1

It is certified that error appears in the above-identified patent and that said Letters Patent is hereby corrected as shown below:

<u>Column 8</u>
Line 41, before "fourth" and insert --a--

<u>Column 9</u>
Line 21, delete "claim 1" and insert --claim 3--

Signed and Sealed this

Twenty-third Day of June, 2009

JOHN DOLL
*Acting Director of the United States Patent and Trademark Office*